United States Patent [19]
Kim

[11] Patent Number: 5,970,355
[45] Date of Patent: Oct. 19, 1999

[54] METHOD FOR FABRICATING SEMICONDUCTOR DEVICE

[75] Inventor: Yong Chan Kim, Chungcheongbuk-do, Rep. of Korea

[73] Assignee: LG Semicon Co., Ltd., Chungcheongbuk-Do, Rep. of Korea

[21] Appl. No.: 09/018,476

[22] Filed: Feb. 4, 1998

[30] Foreign Application Priority Data

Apr. 9, 1997 [KR] Rep. of Korea ............. 97-13071

[51] Int. Cl.$^6$ ................................................. H01L 31/331
[52] U.S. Cl. ........................ 438/309; 438/362; 438/365
[58] Field of Search ................................ 438/309, 322, 438/353, 362, 364, 365, 368

[56] References Cited

U.S. PATENT DOCUMENTS

| | | | |
|---|---|---|---|
| 4,866,000 | 9/1989 | Okita ................................ | 438/365 |
| 5,409,843 | 4/1995 | Yamauchi et al. ................ | 438/365 |
| 5,409,845 | 4/1995 | Robinson et al. ................ | 438/365 |
| 5,444,285 | 8/1995 | Robinson et al. ................ | 438/365 |
| 5,496,744 | 3/1996 | Ishimaru . | |

*Primary Examiner*—Tuan H. Nguyen

[57] ABSTRACT

A method for fabricating a semiconductor device having a base electrode, an emitter electrode, and a collector electrode, includes the steps of: forming first, second, and buried layers in a semiconductor substrate; forming first, second, and third epitaxial layers using the respective buried layers as seeds; forming an isolation region between the first and second epitaxial layers; forming first, second, and third impurity regions connected to the respective buried layers through the respective epitaxial layers; forming fourth, fifth, and sixth impurity regions in the respective epitaxial layers; forming polysilicon layers on the respective epitaxial layers, respectively; defining first, second, and third emitter electrode regions as well as first, second, and third base contact regions; etching portions of the polysilicon layers excluding the emitter electrode regions and the base contact regions down to a predetermined depth; oxidizing the etched portions of the polysilicon layer to grow an oxide layer; implanting N-type impurity ions into the polysilicon layer of the first and second base contact regions and the third emitter electrode region, and P-type ions into the first and second emitter regions and the third base contact region; depositing a metal on the exposed surfaces; and patterning the metal to be in contact with the respective polysilicon layers.

23 Claims, 8 Drawing Sheets

METHOD FOR FABRICATING SEMICONDUCTOR DEVICE

BACKGROUND OF THE INVENTION

1. Field of the Invention

The present invention relates to a semiconductor device, and more particularly, to a method for fabricating a semiconductor device that achieves a uniform current gain due to producing uniform emitter regions, so as to improve reliability of the semiconductor device.

2. Discussion of the Related Art

Generally, a semiconductor device includes a fast bipolar transistor (a field effect transistor in the case of an MOS device) for an arithmetic unit, logic circuits and the like, and a high current bipolar transistor for output circuits. To realize the high current bipolar transistor, an emitter has a wide width. To realize the fast bipolar transistor, an emitter junction and an emitter have thin widths. In the semiconductor device in which the fast bipolar transistor and the high current bipolar transistor are formed in one substrate, current gain of the respective transistors for stable operation is about ±30%.

A conventional method for fabricating a semiconductor device will be described with reference to the accompanying drawings.

FIG. 1a to FIG. 1d are sectional views illustrating process steps according to the first embodiment of a conventional method for fabricating a bipolar transistor.

In this embodiment, two NPN transistors are formed in one substrate.

As shown in FIG. 1a, an N+ conductive type first and second buried layers 13 and 13a are formed in a semiconductor substrate 11 of P-type conductivity by ion implantation. An epitaxial layer 15 of N-type conductivity is formed using the first and second buried layers 13 and 13a as a seed. An oxide film 17 is then grown on the semiconductor substrate 11. P-type conductive impurities are implanted into the epitaxial layer 15 between the first and second buried layers 13 and 13a to form isolation regions 19.

Subsequently, first and second collector regions 21 and 21a are formed by ion implantation, which are respectively connected to the first and second buried layers 13 and 13a. A first base region 23 is formed in the epitaxial layer 15 over the first buried layer 13. A second base region 23a is formed in the epitaxial layer 15 over the second buried layer 13a. In forming the base regions, the collector regions, and the isolation regions, impurity ions are implanted into the respective regions using masks different from one another (not shown).

As shown in FIG. 1b, the oxide film 17 on the first and second base regions 23 and 23a is selectively etched to define first and second emitter regions. The first emitter region is significantly wider than the second emitter region.

A polysilicon layer 25 is formed on an entire surface of the semiconductor substrate 11 including the oxide film 17. Impurity ions are implanted into the entire surface so that they are implanted into the first and second base regions 23 and 23a through the polysilicon layer 25.

The polysilicon layer 25 fills the hole in the oxide layer 17 corresponding to the smaller emitter region. The polysilicon layer 25 merely lines the hole in oxide layer 17 corresponding to the larger emitter region. As such, the walls 25a formed by the polysilicon layer 25 in the hole in the oxide layer 17 present a greater thickness through which to implant ions than does the floor 25b thereof.

Such a difference in the thickness of the polysilicon layer 25 causes the impurity ions to be implanted into the respective base regions at different depths, thereby creating a nonuniform emitter junction Ej.

As shown in FIG. 1c, a photoresist (not shown) is deposited on the polysilicon layer 25 and then patterned by exposure and developing processes. The polysilicon layer 25 is selectively removed by etching process using the patterned photoresist as a mask to form a first emitter poly 25a and a second emitter poly 25b.

As shown in FIG. 1d, an insulating layer 27 is formed on the entire surface of the semiconductor substrate 11 including the first and second polysilicon emitters 25a and 25b. A photoresist (not shown) is deposited on the insulating layer 27 and then patterned by exposure and developing processes. Surfaces of the first and second polysilicon emitters 25a and 25b are partially exposed by etching process using the patterned photoresist as a mask. The insulating layer 27 and the oxide film 17 are selectively removed to expose the surface of the semiconductor substrate 11 in the first and second base regions 23 and 23a and the first and second collector regions 21 and 21a. Subsequently, metal is deposited on the entire surface of the exposed semiconductor substrate 11 including the first and second emitter polys 25a and 25b and patterned to form metal patterns 29. As a result, the conventional method for fabricating the bipolar transistor according to the first embodiment is completed.

In the aforementioned embodiment, when the impurity ions are implanted for the emitter junctions through the polysilicon layer 25, distortion of the emitter junction occurs due to width difference between the first polysilicon emitter poly 25a and the second polysilicon emitter poly 25b.

To prevent the distortion of the emitter junction, a polysilicon layer in which impurity ions are doped is formed. However, such a polysilicon layer has a problem of complicating the overall process. For example, in the case that both an NPN transistor and a PNP transistor are formed in one substrate, a polysilicon layer having impurity ions of different conductivity types must be formed.

To solve such a problem, other conventional method for fabricating a semiconductor device will be described with reference to FIG. 2a to FIG. 2d. In this method, the NPN transistor and the PNP transistor are formed in one substrate.

As shown in FIG. 2a, first and second buried layers 13 and 13a are formed in a P-type semiconductor substrate 11. Here, each of the first buried layer 13 and the second buried layer 13a has N-type conductivity opposite to the semiconductor substrate 11.

Subsequently, first and second epitaxial layers 15 and 15a are grown using the first and second buried layers 13 and 13a as seeds. The first epitaxial layer 15 has N-type and is grown on the first buried layer 13, and the second epitaxial layer 15a has P-type and is grown on the second buried layer 13a.

Then, a plurality of oxide films 17 are formed by local oxidation of silicon (LOCOS) of the first and second epitaxial layers 15 and 15a. At this time, first and second collector regions, and first and second base regions are defined by the oxide films 17.

A second base region 23a is formed on the second epitaxial layer 15a down to a predetermined depth by N-type ion implantation. A first collector region 21 is also formed in the first epitaxial layer 15. A first base region 23 is then formed in the first epitaxial layer 15 down to a predetermined depth by P-type ion implantation. A second collector region 21a is also formed in the second epitaxial layer 15a.

Here, the first collector region 21 is a collector region of the NPN transistor and is connected to the first buried layer 13. The second collector region 21a is a collector region of the PNP transistor and is connected to the second buried layer 13a.

As shown in FIG. 2b, a first chemical vapor deposition (CVD) oxide film 31 is deposited on an entire surface of the semiconductor substrate 11 including the oxide films 17. The first CVD oxide film 31 is selectively removed to expose the first and second base regions 23 and 23a. A P-type doped polysilicon layer 25 is formed on the entire surface including the exposed first and second base regions 23 and 23a. The polysilicon layer 25 is used as an emitter of the PNP transistor. Thus, an emitter junction can be formed at a portion with a predetermined depth, where the polysilicon layer 25 contacts with the second base region 23a.

As shown in FIG. 2c, a second CVD oxide film 31a is deposited on the entire surface of the semiconductor substrate 11 including the polysilicon layer 25. The second CVD oxide film 31a, at a portion where the NPN transistor will be formed, is then selectively removed so that the polysilicon layer 25 is partially exposed. N-type ions are implanted into the exposed polysilicon layer 25 and then annealing is performed. As a result, the emitter junction Ej is formed in the first base region 23.

As shown in FIG. 2d, the polysilicon layer 25 is patterned to form a first emitter 25a and a second emitter 25b. A third CVD oxide film 31b (not shown) is then deposited on the entire surface of the semiconductor substrate 11. The third CVD oxide film 31b is selectively removed to partially expose surfaces of the first and second emitters 25a and 25b. The third and second CVD oxide films 31b and 31a are selectively removed to expose the first and second base regions 23 and 23a as well as the first and second collector regions 21 and 21a. Finally, a metal is deposited on the semiconductor substrate 11 in the exposed first and second emitter polys 25a and 25b, the first and second base regions 23 and 23b, and the first and second collector regions 21 and 21a. The metal is then patterned to form metal patterns 29. As a result, the conventional method for fabricating the semiconductor device is completed.

The aforementioned conventional method for fabricating the semiconductor device has several problems.

First, the operating characteristic of the device deteriorates due to the difference between the current gain of the high current transistor having a wide emitter and current gain of the fast transistor having a wide emitter and the current gain of the fast transistor having a narrow emitter.

Second, in the case that the polysilicon (which is doped with impurities) is used to avoid nonuniformity of the emitter junction, the process steps become complicated.

Third, it is difficult to reduce difference in current gain between the high current transistor and the fast transistor even if the polysilicon which is doped with impurities is used and, at the same time, ion implantation is performed.

Finally, the metal has a poor topology due to step coverage between the polysilicon layer and the CVD oxide film.

SUMMARY OF THE INVENTION

Accordingly, the present invention is directed to a method for fabricating a semiconductor device that substantially obviates one or more of the problems due to limitations and disadvantages of the related art.

An object of the present invention is to provide a method for fabricating a semiconductor device which achieves uniform current gain in transistors and uniform emitter junctions regardless of whether the emitters are of the same or different widths.

Objects of the invention are achieved by providing a method for fabricating a semiconductor device, the method comprising the steps of: providing a semiconductor substrate having buried layers, epitaxial layers on the buried layers, and first impurity regions connected to the buried layers; forming second impurity regions in the epitaxial layers of the semiconductor substrate; forming a polysilicon layer having first portions at a first height and second portions at a second height on the epitaxial layers, the second height being lower than the first height; oxidizing the second portions of the polysilicon layer; forming an emitter junction and a base junction in each of the second impurity regions below the second portions, respectively, of the polysilicon layer; and forming a metal pattern in contact with the first portions of the polysilicon layer, respectively.

The objects of the invention are also fulfilled by providing a method for fabricating a semiconductor device having a base electrode, an emitter electrode, and a collector electrode, the method comprising the steps of: forming first, second, and third buried layers in a semiconductor substrate; forming first, second, and third epitaxial layers using the respective buried layers as seeds; forming an isolation region between the first and second epitaxial layers; forming first, second, and third impurity regions connected to the respective buried layers through the epitaxial layers, respectively; forming fourth, fifth, and sixth impurity regions in the epitaxial layers, respectively; forming polysilicon layers on the epitaxial layers, respectively; defining first, second, and third emitter electrode regions as well as first, second, and third base contact regions in said fourth, fifth and sixth impurity regions, respectively; etching portions of the polysilicon layers excluding the respective emitter electrode regions and the respective base contact regions down to a predetermined depth; oxidizing the etched portions of said polysilicon layer to grow an oxide layer; implanting impurity ions of a first conductivity type into the polysilicon layer of the first and second base contact regions and the third emitter electrode region, respectively, and of a second conductivity type opposite to the first type into the polysilicon layers of the first and second emitter electrode regions and the third base contact region; depositing a metal on the polysilicon layer and the oxide layer; and patterning the metal to be in contact with the polysilicon layers, respectively.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

The invention provides a method for fabricating a semiconductor device including two NPN transistors (one having a narrow emitter and one having a wide emitter) and a PNP transistor formed in one substrate.

Figure 1A:
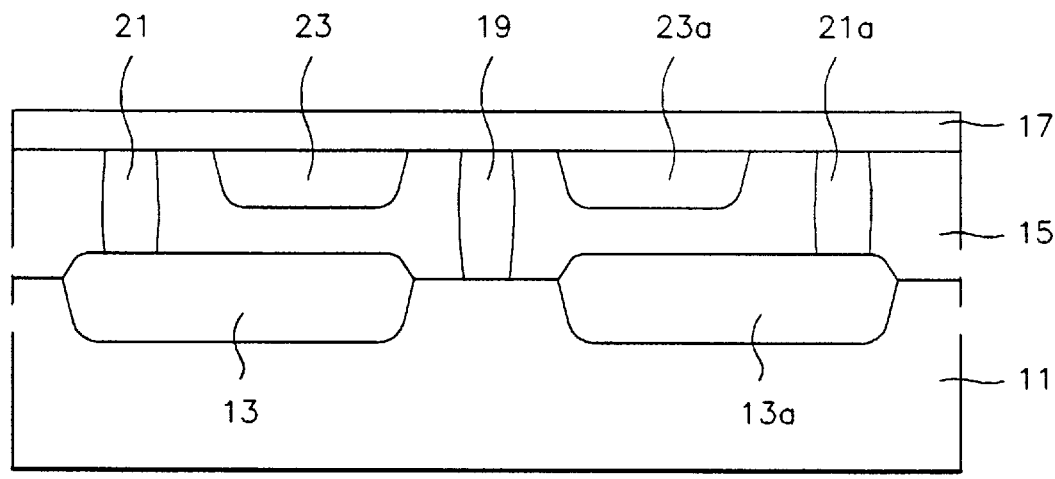
FIG. 1a to FIG. 1d are sectional views illustrating a conventional method for fabricating a semiconductor device.
Figure 1B:
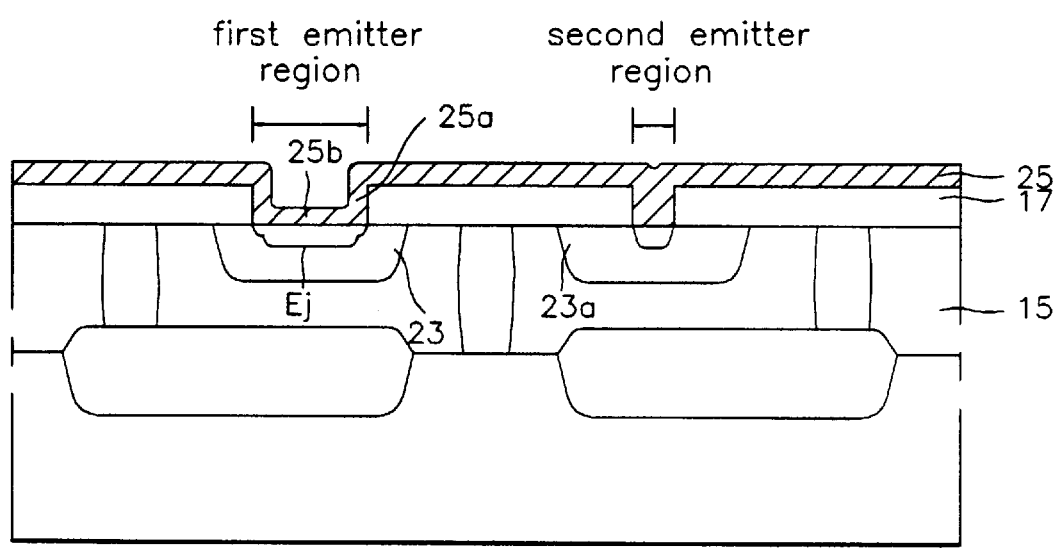
Figure 1C:
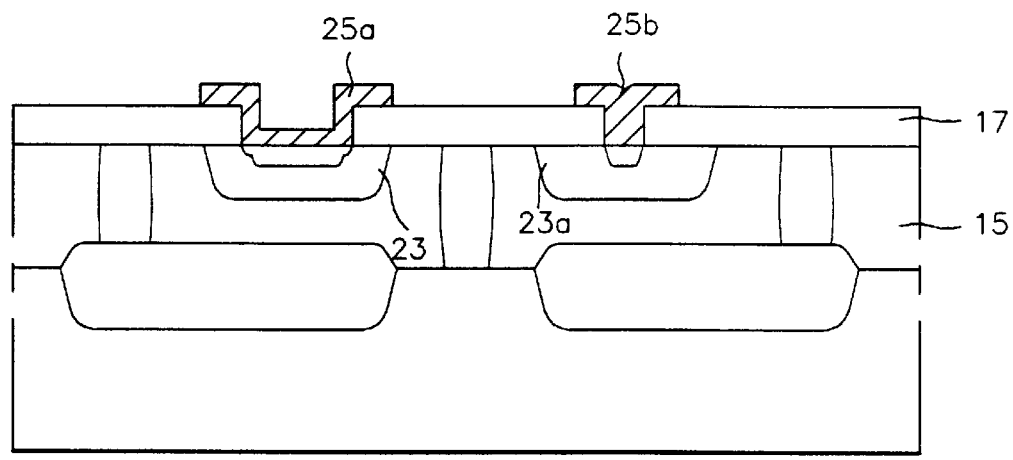
Figure 1D:
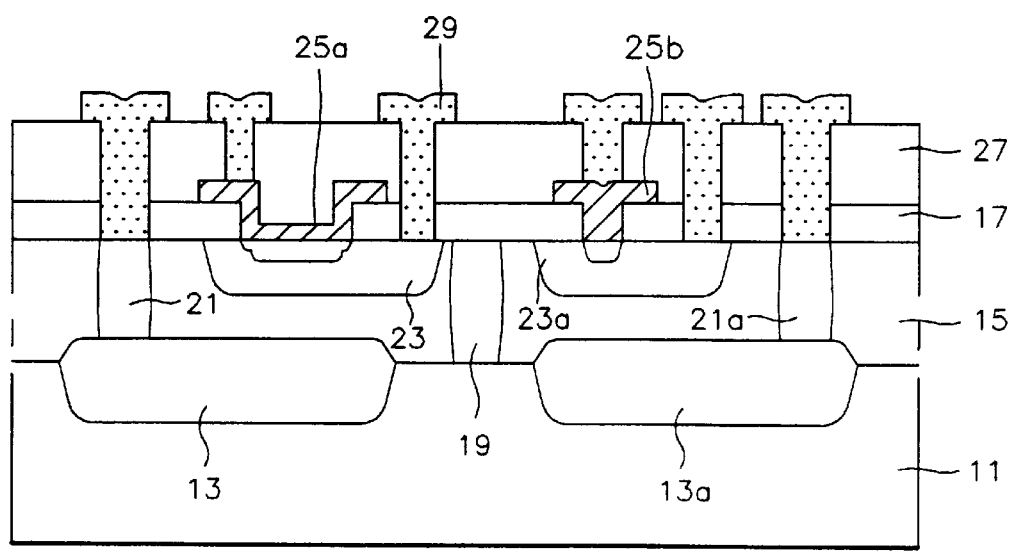
Figure 2A:
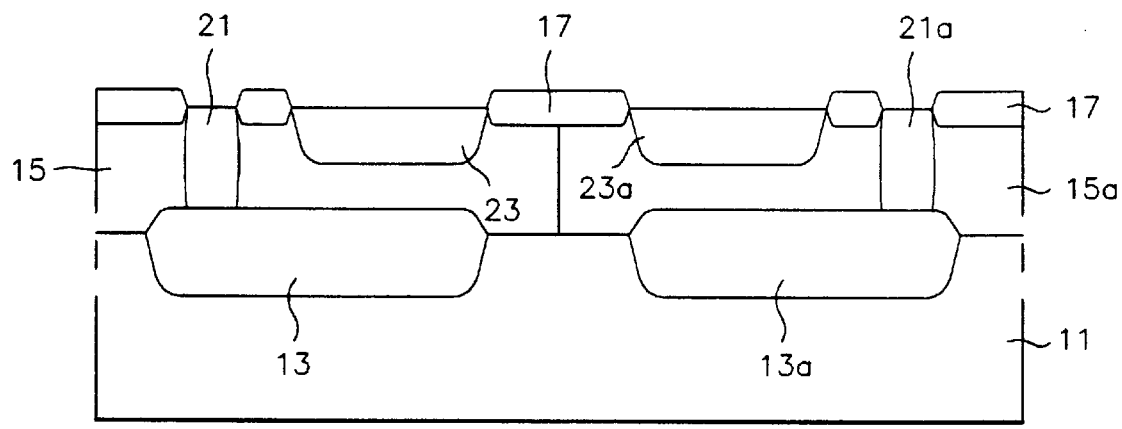
FIG. 2a to FIG. 2d are sectional views illustrating another conventional method for fabricating a semiconductor device.
Figure 2B:
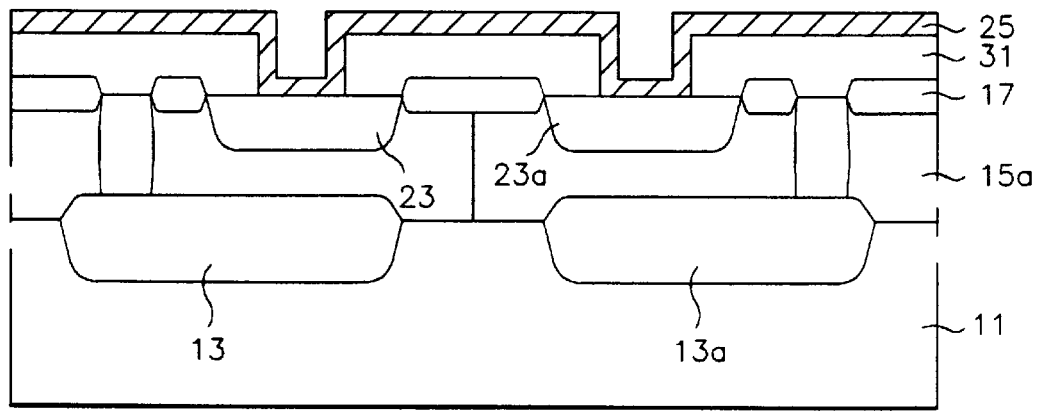
Figure 2C:
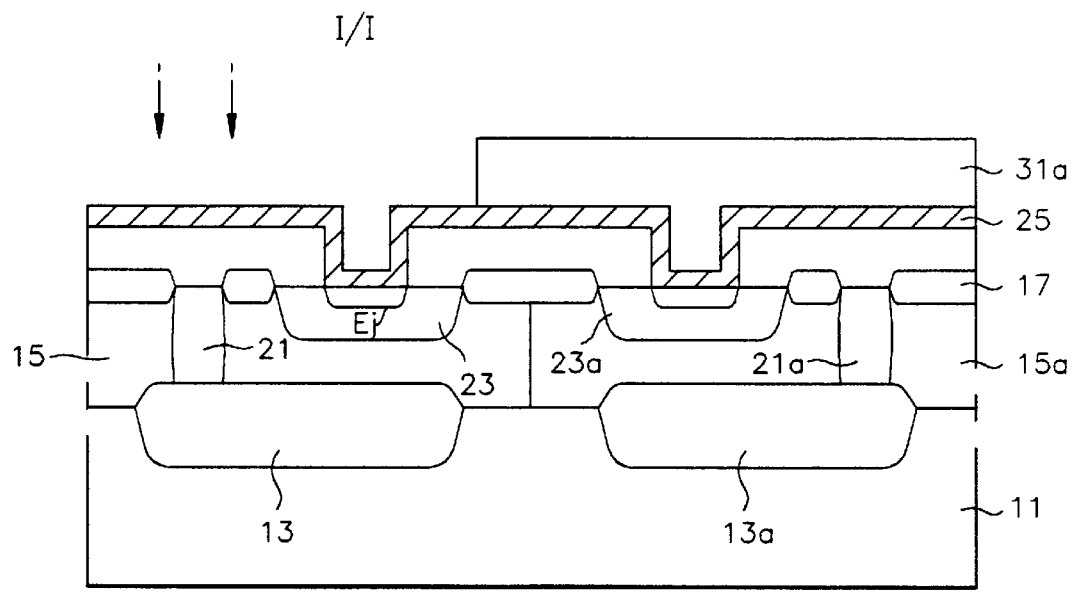
Figure 2D:
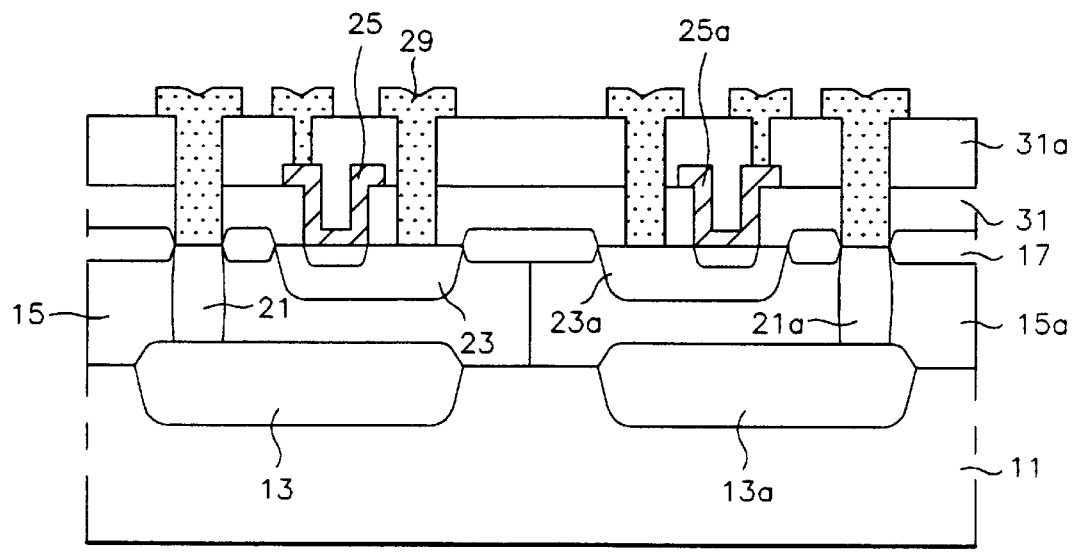
Figure 3A:
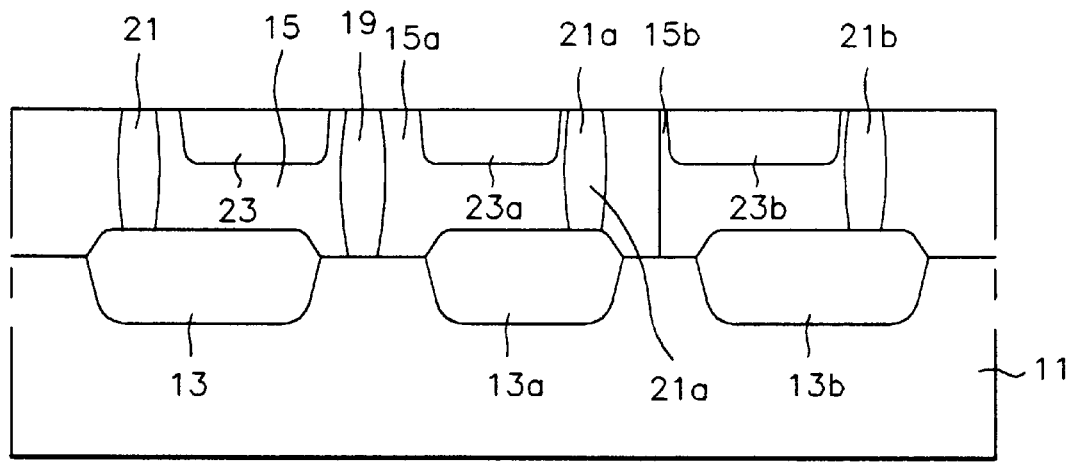
FIG. 3a to FIG. 3f are sectional views illustrating a method for fabricating a semiconductor device according to the present invention.

As shown in FIG. 3a, first and second buried layers 13 and 13a of N+ conductivity type and a third buried layer 13b of P+ conductivity type are formed in a P-type semiconductor substrate 11. First, second, and third epitaxial layers 15, 15a and 15b are grown using the first, second, and third buried layers 13, 13a and 13b as seeds. The first and second epitaxial layers 15 and 15a have N-type while the third epitaxial layer 15b has P-type conductivity.

Subsequently, a P-type isolation region 19 is formed between the first epitaxial layer 15 and the second epitaxial layer 15a by ion implantation using a mask. N-type first and second collector regions 21 and 21a are formed to be respectively connected to the first and second buried layers 13 and 13a. A P-type third collector region 21b is formed to be connected to the third buried layer 13b.

Thereafter, P-type first and second base regions 23 and 23a are formed in the first and second epitaxial layers 15 and 15a down to a predetermined depth by ion implantation. An N-type third base region 23b is formed in a surface of the third epitaxial layer 15b.

Figure 3B:
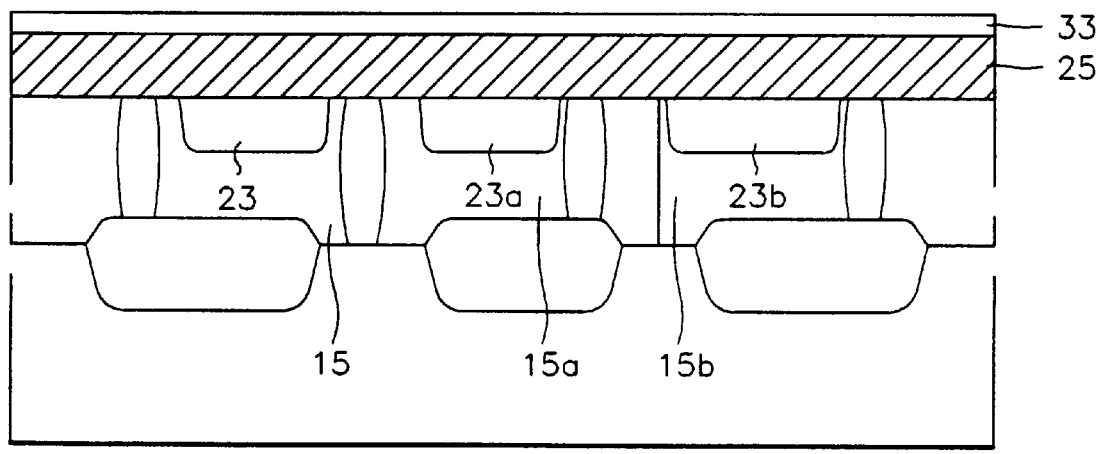

As shown in FIG. 3b, a polysilicon layer 25 (which is intrinsic not doped with impurity ions) is formed on all the exposed surfaces including those of the respective epitaxial layers 15, 15a and 15b. A first insulating film 33 is formed on the polysilicon layer 25. Here, the first insulating film 33 is, e.g., a silicon nitride film.

Figure 3C:
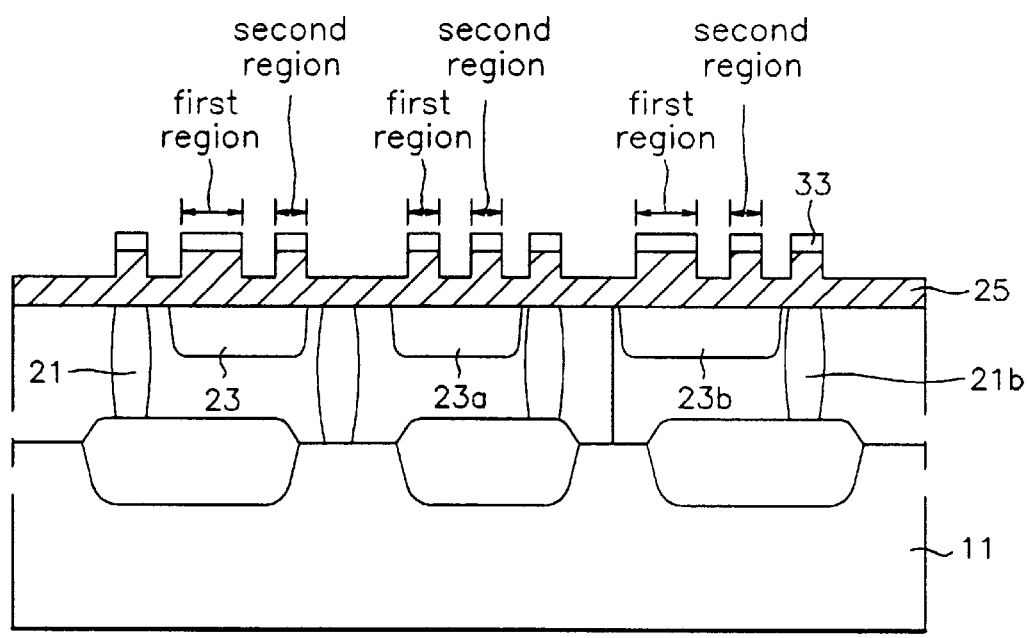

As shown in FIG. 3c, a photoresist (not shown) is deposited on the first insulating film 33 and patterned by exposure and developing processes. The first insulating film 33 is selectively removed by an etching process using the patterned photoresist as a mask. At this time, the first insulating film 33 in areas over the first, second and third collector regions 21, 21a and 21b as well as over first and second regions on the first, second, and third base regions 23, 23a and 23b is maintained as it is without being removed. Here, a first region will become an emitter region and a second region will become a base contact region. The polysilicon layer 25 is etched down to a predetermined depth by using the remaining first insulating film 33 as a mask. At this time, the etching depth is approximately half of overall thickness of the polysilicon layer 25.

Figure 3D:
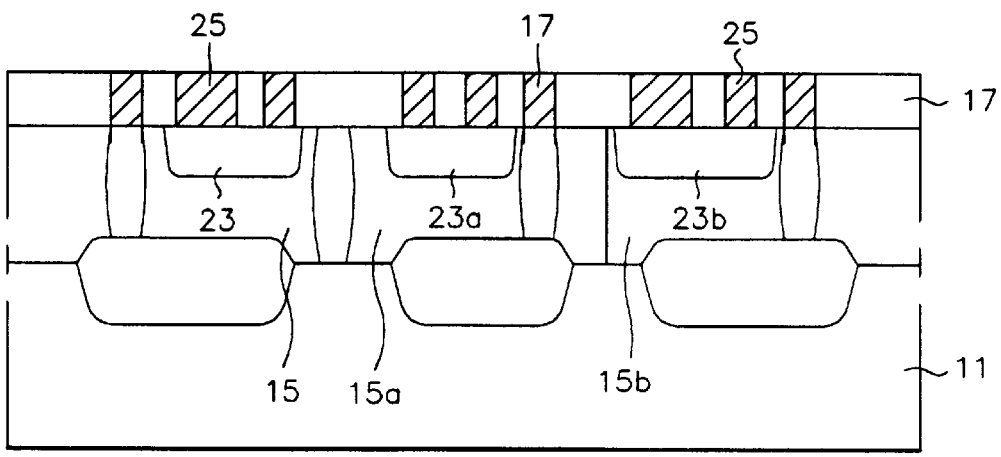

As shown in FIG. 3d, the exposed polysilicon layer 25 is oxidized to grow an oxide film 17. Then, the remaining first insulating film 33 is removed. Here, the oxide film 17 is grown to the height of the originally formed polysilicon layer before etching. The oxide film 17 is used as an insulating film for the overlaying metal pattern which will be described later. Since there is no step coverage between the oxide film 17 and the polysilicon layer, it is possible to achieve a good topology of the structure formed in and on the substrate 11.

Figure 4:
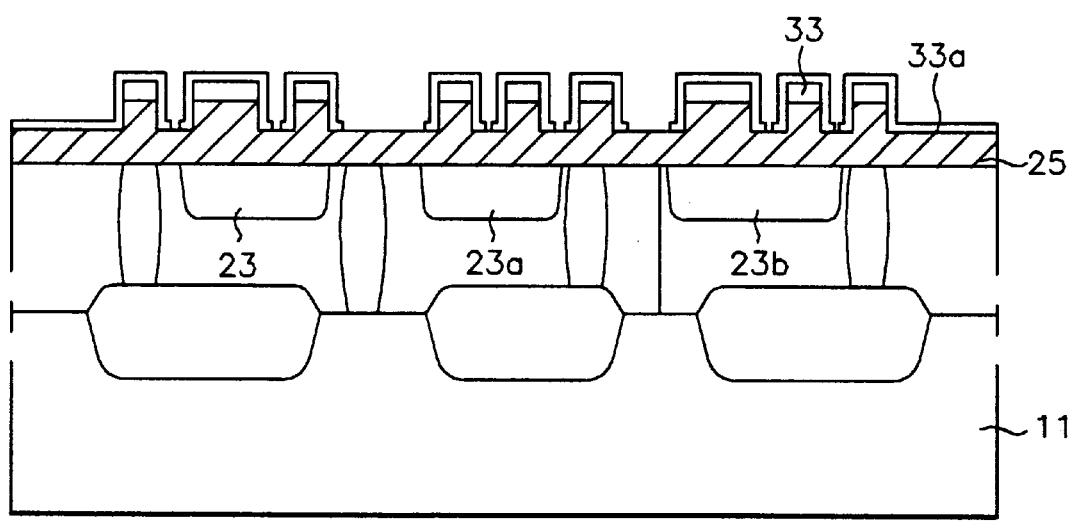
FIG. 4 illustrates an optional additional point in the method.

Meanwhile, to remove bird's head formations which may occur during oxidation, the polysilicon layer 25 is etched using the remaining first insulating film 33 as a mask and sides of the etched polysilicon layer 25 are masked by a second insulating film 33a, as shown in FIG. 4.

As shown in FIG. 3d, the oxide film 17 is grown by oxidation so as not to produce bird's head.

Figure 3E:
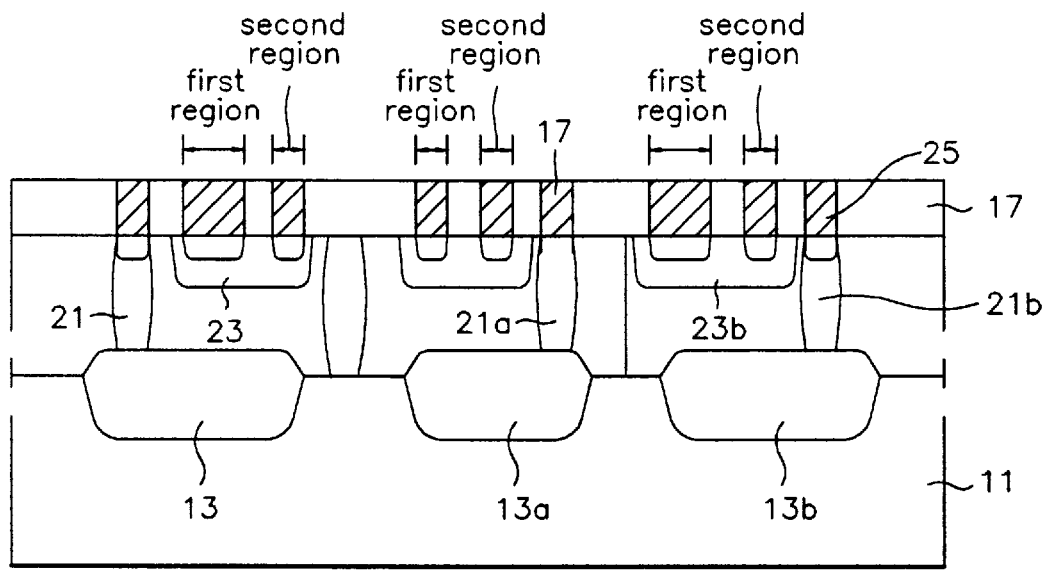

As shown in FIG. 3e, P-type impurity ions are implanted into the second region (the base contact region) in the first and second base regions 23 and 23a and into the first region (the emitter region) in the third base region 23b. The regions into which the impurity ions are implanted are masked by the insulating film or the photoresist. Subsequently, N-type impurity ions are implanted into the entire surface. Annealing is then performed to form an emitter junction and a base junction.

Figure 3F:
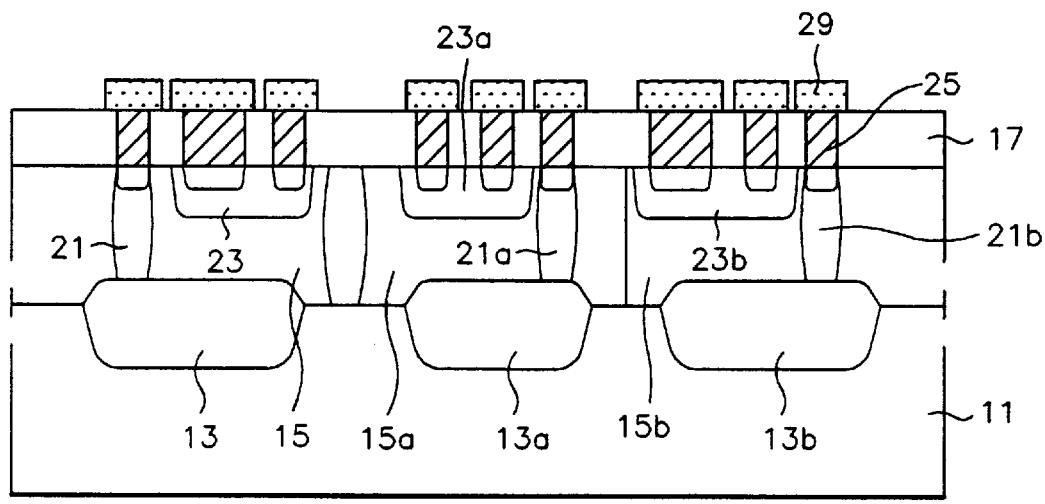

Thereafter, as shown in FIG. 3f, a metal is deposited on the entire surface including the remaining portions of the polysilicon layer 25 and patterned. Finally, metal patterns 29 are formed corresponding to the portions of the polysilicon layer 25.

As a result, the method for fabricating the semiconductor device according to the present invention is completed. The aforementioned process steps may be applied to a method for fabricating a field effect transistor. Additionally, as an alternative embodiment, the conductivity types for the structures can be reversed.

As aforementioned, the method for fabricating the semiconductor device according to the present invention has the following advantages.

First, the NPN transistor and the PNP transistor have uniform emitter junctions regardless of emitter widths, so that differences between current gains of the respective transistors can be minimized.

Second, such uniform emitter junctions stabilizes characteristics of the transistor.

Third, since the polysilicon layer is used for the emitters and the insulating film, step coverage between the polysilicon layer and the insulating film does not occur, thereby improving topology of the metal in the final process step.

Finally, since the emitter regions, the base contact regions, and the collector contact regions are defined by one patterning process, it is possible to ensure a high degree of alignment for the photolithographic process.

It will be apparent to those skilled in the art that various modifications and variations can be made in the method for fabricating the semiconductor device of the present invention without departing from the spirit or scope of the invention. Thus, it is intended that the present invention cover the modifications and variations of the invention provided they come within the scope of the appended claims and their equivalents.

What is claimed is:

1. A method for fabricating a semiconductor device comprising the steps of:

providing a semiconductor substrate having buried layers, epitaxial layers on the buried layers, and first impurity regions connected to the buried layers;

forming second impurity regions in the epitaxial layers of the semiconductor substrate;

forming a polysilicon layer having first portions at a first height and second portions at a second height on the epitaxial layers, the second height being lower than the first height;

oxidizing the second portions of the polysilicon layer;

forming an emitter junction and a base junction in each of the second impurity regions below the second portions, respectively, of the polysilicon layer; and forming a metal pattern in contact with the first portions of the polysilicon layer, respectively.

2. The method for fabricating a semiconductor device as claimed in claim 1, wherein the first impurity regions are collector regions and the second impurity regions are a base region.

3. The method for fabricating a semiconductor device as claimed in claim 1, wherein the second portions of the polysilicon layer are oxidized to form an oxide film having the first height.

4. The method for fabricating a semiconductor device as claimed in claim 1, wherein the semiconductor substrate is of a first conductivity type, one of the buried layers is of said first conductivity type and at least a remaining one of the buried layers is of a second type of conductivity opposite to said first type.

5. The method for fabricating a semiconductor device as claimed in claim 4, wherein said step of providing provides three of said first impurity regions two of which are of said second conductivity type, and provides an isolation region between the two first impurity regions of said second conductivity type.

6. The method for fabricating a semiconductor device as claimed in claim 4, wherein the first conductivity type is P-type and said second conductivity type is N-type.

7. The method for fabricating a semiconductor device as claimed in claim 4, wherein said method provides two of said buried layers, said epitaxial layers, said first impurity regions and said second impurity regions such that two transistors are formed, a first one of said transistors being an NPN transistor and a second one of said transistors being a PNP transistor.

8. The method for fabricating a semiconductor device as claimed in claim 7, wherein said method provides three of said buried layers, said epitaxial layers, said first impurity regions and said second impurity regions such that three transistors are formed, a third one of said transistors being an NPN transistor.

9. The method for fabricating a semiconductor device as claimed in claim 8, wherein an emitter junction for said first transistor is wider than an emitter junction for said third transistor.

10. A method for fabricating a semiconductor device having a base electrode, an emitter electrode, and a collector electrode, the method comprising the steps of:

forming first, second, and third buried layers in a semiconductor substrate;

forming first, second, and third epitaxial layers using the respective buried layers as seeds;

forming an isolation region between the first and second epitaxial layers;

forming first, second, and third impurity regions connected to the respective buried layers through the epitaxial layers, respectively;

forming fourth, fifth, and sixth impurity regions in the epitaxial layers, respectively;

forming polysilicon layers on the epitaxial layers, respectively;

defining first, second, and third emitter electrode regions as well as first, second, and third base contact regions in said fourth, fifth and sixth impurity regions, respectively;

etching portions of the polysilicon layers excluding the respective emitter electrode regions and the respective base contact regions down to a predetermined depth;

oxidizing the etched portions of said polysilicon layer to grow an oxide layer;

implanting impurity ions of a first conductivity type into the polysilicon layer of the first and second base contact regions and the third emitter electrode region, respectively, and of a second conductivity type opposite to the first type into the polysilicon layers of the first and second emitter electrode regions and the third base contact region;

depositing a metal on the polysilicon layer and the oxide layer; and patterning the metal to be in contact with the polysilicon layers, respectively.

11. The method as claimed in claim 10, wherein the semiconductor substrate is of a first conductivity type and the first and second buried layers are of a second conductivity type opposite to the first type and the third buried layer is of the first conductivity type.

12. The method as claimed in claim 11, wherein the first conductivity type is P-type and the second conductivity type is N-type.

13. The method as claimed in claim 10, wherein the first and second epitaxial layers and the first and second buried layers are of a second conductivity type, and the third epitaxial layer and the third buried layer is of a second conductivity type.

14. The method as claimed in claim 13, wherein the first and second epitaxial layers are of N-type conductivity and the third epitaxial layer is of P-type conductivity.

15. The method as claimed in claim 10, wherein the first, second, and the third impurity regions are collector regions.

16. The method as claimed in claim 15, wherein the first and second impurity regions are of N-type conductivity and the third impurity region is of P-type conductivity.

17. The method as claimed in claim 10, wherein the fourth, fifth, and sixth impurity regions are base regions.

18. The method as claimed in claim 17, wherein the fourth and fifth impurity regions have P-type conductivity and the sixth impurity region is of N-type conductivity.

19. The method as claimed in claim 10, wherein the first emitter electrode region has a width wider than a width of the second emitter electrode region.

20. The method as claimed in claim 10, wherein the oxide film is grown to a same thickness as of the unetched polysilicon layer.

21. The method as claimed in claim 10, wherein the impurity ions implanted into the first and second base contact regions and the third emitter electrode region are of the same conductivity type as the semiconductor substrate.

22. The method as claimed in claim 10, wherein the surface of the etched polysilicon layer is masked by an insulating film.

23. The method as claimed in claim 22, wherein an insulating film is formed on the surface of the etched polysilicon layer to prevent formation of bird's head structures during oxidation of the polysilicon layer.

* * * * *